United States Patent
Lee et al.

(10) Patent No.: US 10,580,559 B2
(45) Date of Patent: Mar. 3, 2020

(54) COIL COMPONENT

(71) Applicant: SAMSUNG ELECTRO-MECHANICS CO., LTD., Suwon-si, Gyeonggi-do (KR)

(72) Inventors: Sang Jong Lee, Suwon-si (KR); Su Bong Jang, Suwon-si (KR); Han Kim, Suwon-si (KR); Min Ki Jung, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 208 days.

(21) Appl. No.: 15/619,974

(22) Filed: Jun. 12, 2017

(65) Prior Publication Data

US 2018/0012700 A1 Jan. 11, 2018

(30) Foreign Application Priority Data

Jul. 7, 2016 (KR) .................. 10-2016-0085997
Nov. 30, 2016 (KR) .................. 10-2016-0161452

(51) Int. Cl.
| | |
|---|---|
| *H01F 5/00* | (2006.01) |
| *H01F 17/00* | (2006.01) |
| *H01F 27/32* | (2006.01) |
| *H01F 27/29* | (2006.01) |
| *H03H 7/38* | (2006.01) |

(52) U.S. Cl.
CPC .......... *H01F 17/0013* (2013.01); *H01F 5/00* (2013.01); *H01F 27/292* (2013.01); *H01F 27/323* (2013.01); *H01F 2017/0073* (2013.01); *H03H 7/38* (2013.01)

(58) Field of Classification Search
CPC ............................ H01F 5/00; H01F 27/00–36
USPC ............ 336/65, 83, 200, 206–208, 232–234
See application file for complete search history.

(56) References Cited

U.S. PATENT DOCUMENTS

| | | | |
|---|---|---|---|
| 9,196,410 B2 * | 11/2015 | Lee | ..................... H01F 17/0013 |
| 2013/0314193 A1 | 11/2013 | Lee | |
| 2016/0372261 A1* | 12/2016 | Ozawa | ................ H01F 17/0013 |

FOREIGN PATENT DOCUMENTS

| | | |
|---|---|---|
| KR | 10-0733279 A | 6/2007 |
| KR | 10-1396649 A | 5/2014 |
| KR | 10-1532148 A | 6/2015 |

* cited by examiner

*Primary Examiner* — Tuyen T Nguyen
(74) *Attorney, Agent, or Firm* — Morgan, Lewis & Bockius LLP

(57) ABSTRACT

A coil component may include a body including a plurality of insulating layers having coil patterns disposed on the plurality of insulating layers. The coil pattern may include a coil portion, a leading portion disposed on one side of the insulating layer, and a connection portion connecting the coil portion and the leading portion, a pattern line of the coil portion may have an arc shape, and the connection portion may be formed in a tangent line direction of the coil portion from one end of the leading portion.

20 Claims, 6 Drawing Sheets

COIL COMPONENT

CROSS-REFERENCE TO RELATED APPLICATION

This application claims the benefit of Korean Patent Application Nos. 10-2016-0085997 filed on Jul. 7, 2016 and 10-2016-0161452 filed on Nov. 30, 2016 with the Korean Intellectual Property Office, the disclosures of which are incorporated herein by reference.

TECHNICAL FIELD

The present disclosure relates to a coil component.

BACKGROUND

Recently, a smartphone has used a signal of a wide frequency band. A coil component has been mostly used as an impedance matching circuit in an RF system for transmitting and receiving high frequency signals and, as a result, the use of high frequency coil components is continuously increasing.

For miniaturization of the coil component, the coil component has been required to be usable at a high frequency of 100 MHz or higher, due to a self resonance frequency (SRF) of a high frequency band and a low specific resistance. Furthermore, high quality factor (Q) characteristics have been required to reduce a loss in a device frequency.

Because the quality factor (Q) is being realized using a material having a low specific resistance in a photolithography method, the coil component may be greatly dependent on characteristics of the material. However, when the same material is used, optimization of a shape and a structure of a coil of the coil component may be required for realizing the high quality factor (Q) characteristics.

SUMMARY

An aspect of the present disclosure may provide a coil component capable of improving Q characteristics by changing a shape of a coil.

According to an aspect of the present disclosure, a coil component may include a body including a plurality of insulating layers having coil patterns disposed on the plurality of insulating layers. The coil pattern may include a coil portion, a leading portion disposed on one side of the insulating layer, and a connection portion connecting the coil portion and the leading portion, a pattern line of the coil portion may have an arc shape, and the connection portion may be formed to be extended in a tangent line direction from an end of the pattern line forming the coil portion, in order to be connected to an end of the leading portion.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Exemplary embodiments of the present disclosure will now be described in detail with reference to the accompanying drawings.

As inductance is increased or resistance is reduced, Q characteristics of a coil component improve.

Accordingly, the purpose of the present disclosure is to improve the Q characteristics by reducing the resistance of the coil component and to suggest an optimal coil shape for this purpose.

Hereinafter, the coil component according to the present disclosure will be described.

Figure 1:
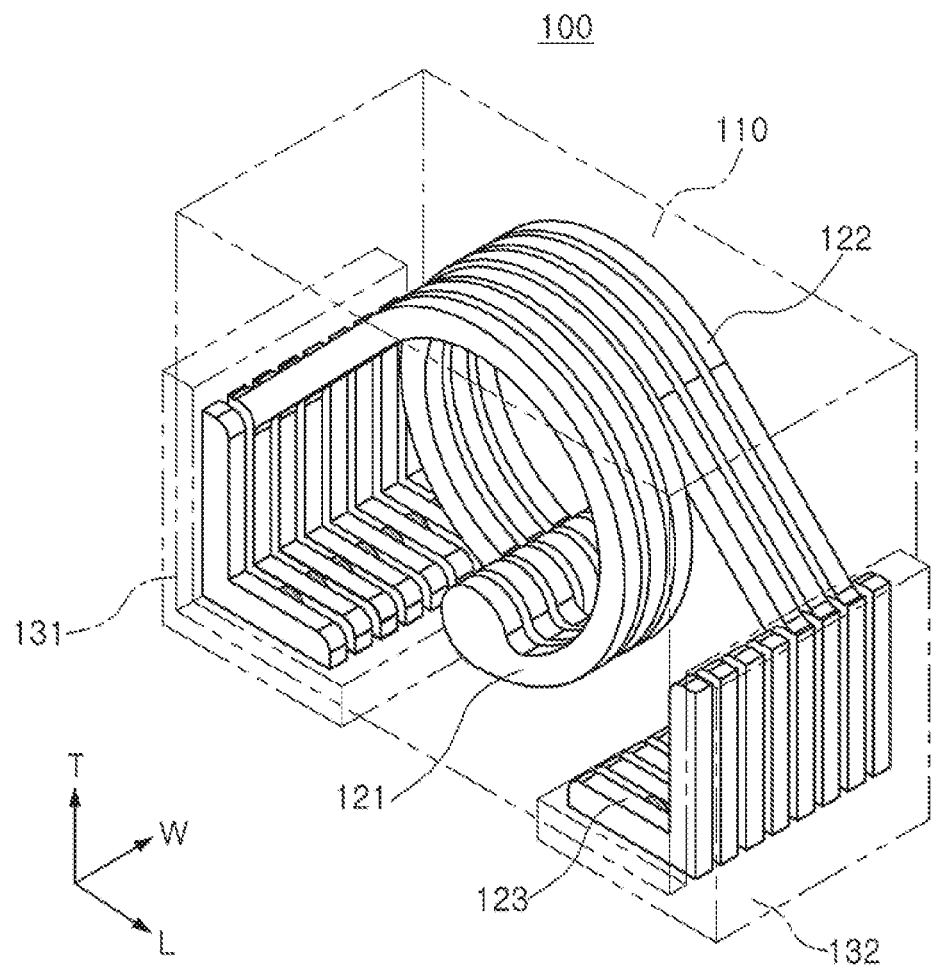
FIG. 1 is a perspective view schematically showing a coil component according to an exemplary embodiment in the present disclosure.
Figure 2A:
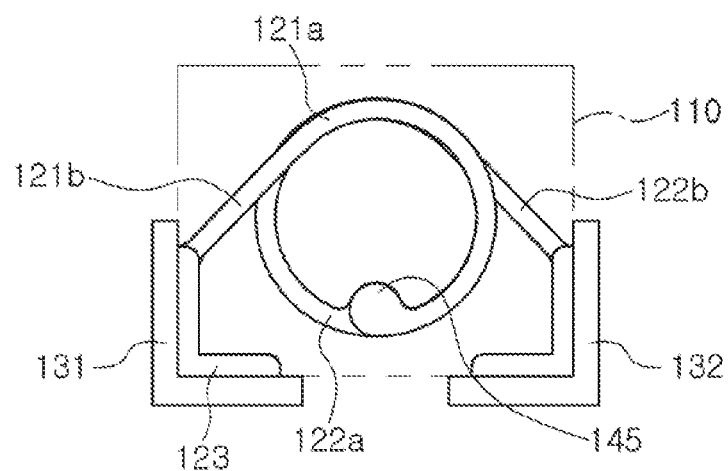
FIGS. 2A to 2C are cross-sectional views showing a shape of a coil pattern of a coil component according to various exemplary embodiments in the present disclosure.
Figure 2B:
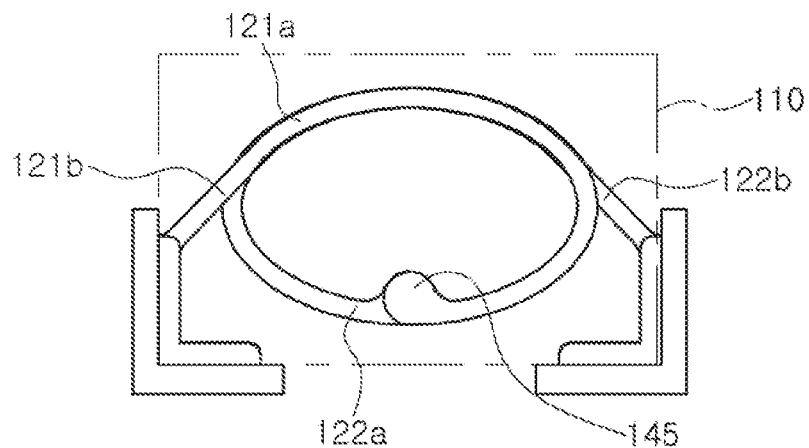
Figure 2C:
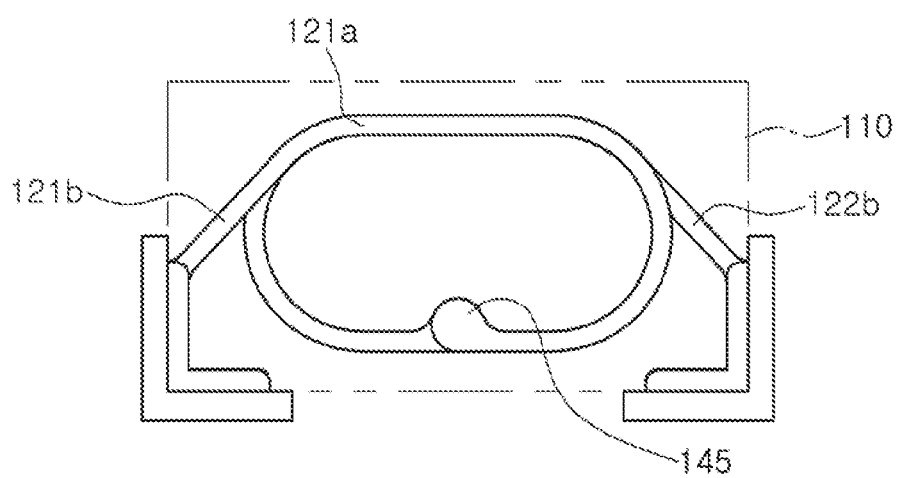
Figure 3A:
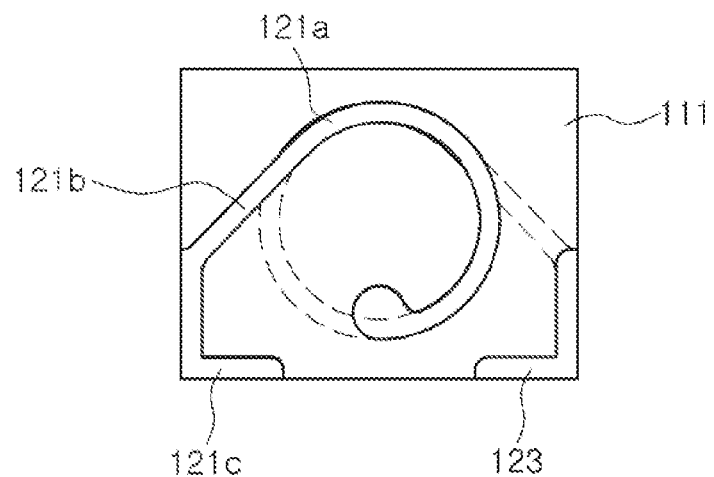
FIGS. 3A and 3B are plan views schematically showing the shape of the coil pattern formed on an insulating layer according to the exemplary embodiment in the present disclosure.
Figure 3B:
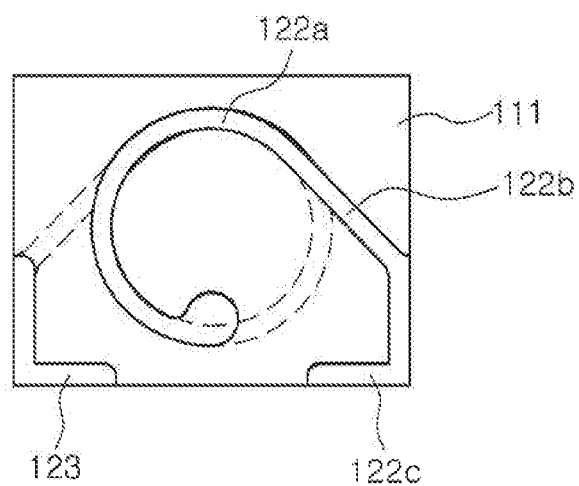

FIG. 1 is a perspective view schematically showing a coil component according to an exemplary embodiment in the present disclosure, FIGS. 2A to 2C are cross-sectional views showing a shape of a coil pattern of a coil component according to various exemplary embodiments in the present disclosure, and FIGS. 3A and 3B are plan views schematically showing the shape of the coil pattern formed on an insulating layer according to the exemplary embodiment in the present disclosure.

Referring to FIGS. 1 through 3, a coil component 100 according to an exemplary embodiment in the present disclosure may include a body 110 including a plurality of insulating layers 111 including coil patterns. Coil patterns 121 and 122 include coil portions 121a and 122a, leading portions 121c and 122c disposed on one side of the insulating layer 111, and connection portions 121b and 122b, connecting the coil portions 121a and 122a and the leading portions 121c and 122c, in which a pattern line of the coil portion has an arc shape and the connection portion is formed in a tangent line direction of the coil portion from one end of the leading portion.

The body 110 may be formed by stacking a plurality of insulating layers 111. The plurality of insulating layers 111 forming the body 110 is sintered and therefore boundaries between adjacent insulating layers 111 may be integrated to be hardly confirmed without using a scanning electron microscope (SEM).

The body 110 may have a hexahedral shape and include a top surface and a bottom surface, an end surface connecting the top surface and the bottom surface, and an end surface connecting the top and bottom surfaces with the end surface. If a direction of the hexahedron is defined in order to clearly describe the exemplary embodiment in the present disclosure, each of L, W and T, shown in FIG. 1, refers to a longitudinal direction, a width direction, and a thickness direction.

The body 110 may be formed of ferrite, in which the ferrite may be, for example, Mn—Zn-based ferrite, Ni—Zn-based ferrite, Ni—Zn—Cu-based ferrite, Mn—Mg-based ferrite, Ba-based ferrite, Li-based ferrite, or the like, but is not limited thereto.

The coil patterns 121 and 122 may be formed by printing a conductive paste containing a conductive metal on the plurality of insulating layers 111 forming the body 110 at a predetermined thickness.

The conductive metal forming the coil pattern is not particularly limited as long as it has excellent electrical conductivity. For example, the conductive metal may be anyone of silver (Ag), palladium (Pd), aluminum (Al), nickel (Ni), titanium (Ti), gold (Au), copper (Cu), and platinum (Pt), a mixture thereof, or the like.

The coil patterns 121 and 122 may include the coil portions 121a and 122a, the leading portions 121c and 122c disposed on one side of the insulating layer, and the connection portions 121b and 122b, connecting the coil portions 121a and 122a and the leading portions 121c and 122c.

The coil pattern may be made up of a first coil pattern 121, exposed to one surface in a longitudinal direction of the body 110, and a second coil pattern 122, exposed to the other surface in the longitudinal direction and having a polarity different from that of the first coil pattern 121.

The first coil pattern 121 may include a first coil portion 121a, a first leading portion 121c exposed to a surface perpendicular to a stacked surface of the body 110, and a first connection portion 121b connecting the first coil portion 121a and the first leading portion 121c, and the second coil pattern 122 may include a second coil portion 122a, a second leading portion 122c exposed to a surface perpendicular to the stacked surface of the body 110, and a second connection portion 122b connecting the second coil portion 122a and the second leading portion 122c.

For example, the first and second leading portions 121c and 122c may be exposed to one end surface and the other end surface in a longitudinal direction L of the body 110, perpendicular to the stacked surface of the insulating layers that are stacked.

Further, the first and second leading portions 121c and 122c may also be exposed to a bottom surface that is a substrate mounted surface of the body 110. That is, the first and second leading portions 121c and 122c may be formed on a lower portion of one side and a lower portion of the other side of the insulating layer, respectively, and the first and second leading portions 121c and 122c may have an L-letter shape in a cross section in a width-thickness direction of the body 110.

The connection portion may be formed to extend in a tangent line direction of the coil portion, from one end of the leading portion, and may be in contact with an upper portion of the coil portion.

That is, the first connection portion 121b may be formed to extend in a tangent line direction of the first coil portion 121a, from one end of the first leading portion 121c formed on one side of the insulating layer 111, and the second connection portion 122b may be formed to extend in a tangent line direction of the second coil portion 122a, from one end of the second leading portion 122c formed on the other side of the insulating layer.

The leading portion may be exposed to the bottom surface of the body, and therefore the connection portion may be formed to have a shortest distance between the leading portion and the coil portion, that is, formed in a tangent line direction of the coil portion from one end of the leading portion.

When the connection portion is formed in the tangential direction of the coil portion, an edge formed by the connection portion and the leading portion may be formed at an obtuse angle and, as a result, the resistance of the entire coil pattern may be reduced and the Q characteristics may be improved.

Vias 145 may be formed at predetermined positions on each insulating layer that includes the coil pattern, and the first and second coil patterns formed on each insulating layer may be electrically connected to each other through the vias, to form one coil.

The via 145 may be formed within a pattern line of the coil portion.

The vias 145 may be connected to each other by a via pad (not shown) for a stable via connection and an alignment between patterns, in which the via pad may be wider than a width of the coil pattern.

The via pad may be formed around the pattern line of the coil portion or may be formed inside or outside the coil portion, but is not limited thereto.

The via 145 may be formed by forming a through hole, using a mechanical drill or a laser drill, and then filling the through hole with a conductive material by plating.

The via 145 may include conductive materials such as copper (Cu), aluminum (Al), silver (Ag), tin (Sn), gold (Au), nickel (Ni), lead (Pd), or an alloy thereof.

At this point, as the plurality of insulating layers 111 that include the coil patterns are stacked in a width direction W or a longitudinal direction L of the body 110, the first and second coil patterns 121 and 122 may be disposed in a direction perpendicular to the substrate mounted surface of the body 110. That is, the coil patterns may be disposed in a direction perpendicular to the top and bottom surfaces of the body 110.

Figure 5A:
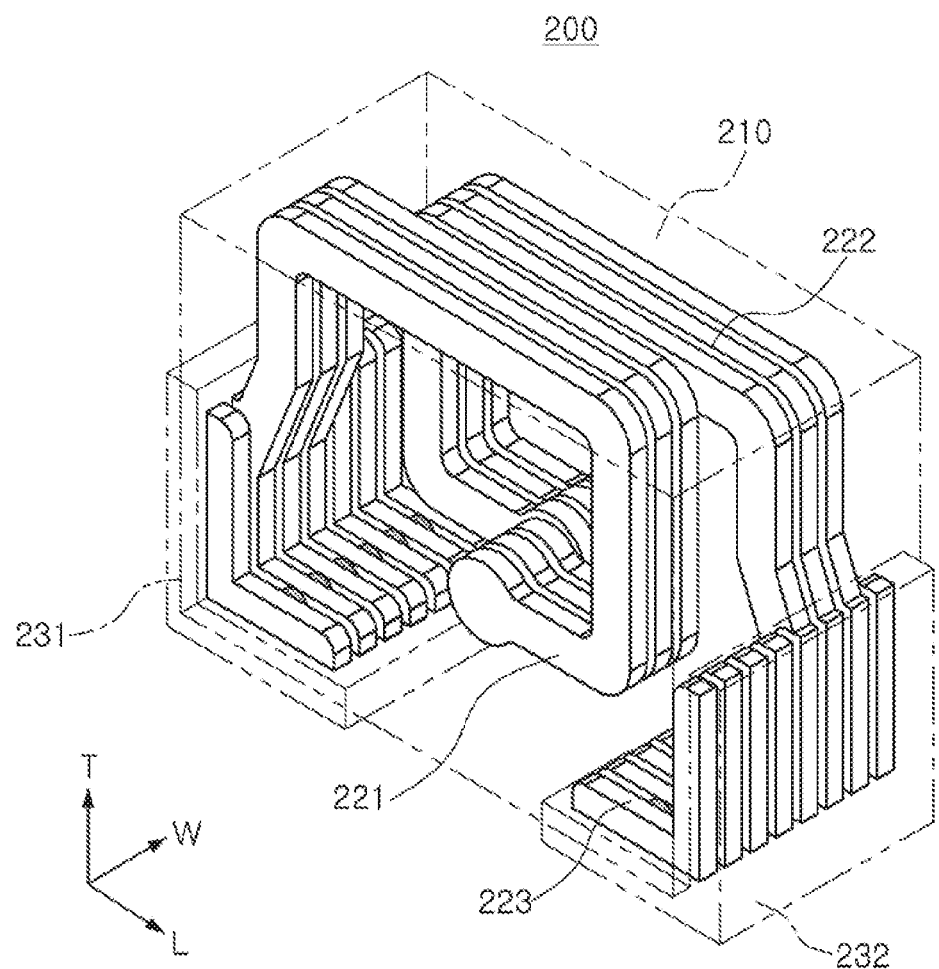
FIG. 5A is a perspective view schematically showing a coil component according to a comparative example of the present disclosure and FIG. 5B is a cross-sectional view schematically showing the coil component according to the comparative example of the present disclosure.
Figure 5B:
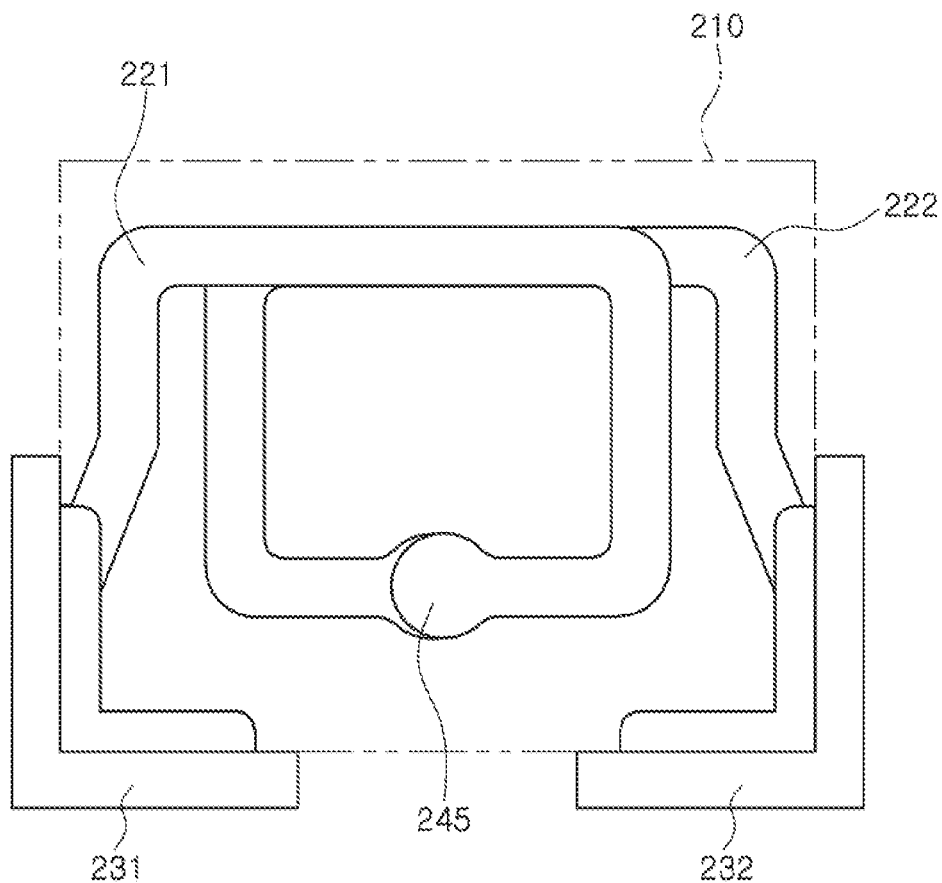

FIG. 5A is a perspective view schematically showing a coil component according to a comparative example of the present disclosure and FIG. 5B is a cross-sectional view schematically showing the coil component according to the comparative example of the present disclosure.

Referring to FIGS. 5A and 5B, coil patterns 221 and 222 of a coil component 200 according to the comparative example may have a rectangular shape. However, when the coil pattern has a polygonal shape with an edge, the edge of the coil pattern may have a higher current density than other portions. Therefore, in the case of the comparative example, the resistance of the coil component itself may be increased due to the existence of the edges and, as a result, the Q characteristics may deteriorate.

Referring to FIGS. 2A-2C, in the coil component 100 according to the exemplary embodiment in the present disclosure, the pattern lines of the coil portions 121a and 122a of the coil patterns may have an arc shape without an edge and, as a result, the resistance of the coil component may be lowered and the Q characteristics may be improved.

The pattern lines of the coil portions 121a and 122a may have any one of circular, oval, and track shapes.

Figure 4A:
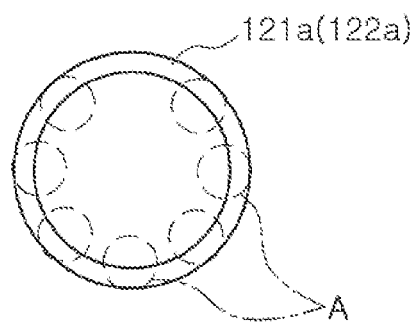
FIGS. 4A through 4C are views showing a via formation position of the coil component of FIGS. 2A-2C.
Figure 4B:
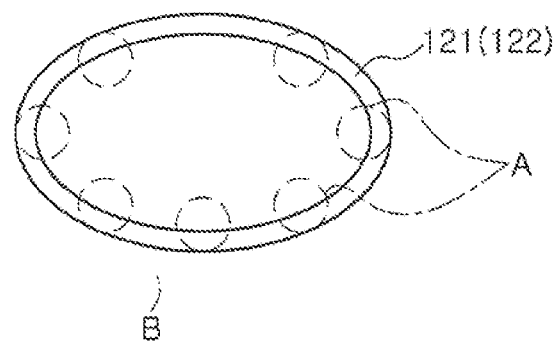
Figure 4C:
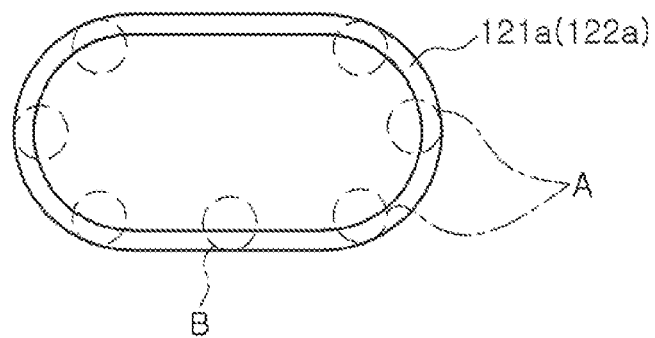

FIGS. 4A through 4C are views showing a via formation position of the coil component of FIGS. 2A-2C. In FIGS. 3A and 3B, a portion indicated by a dotted line shows the via formation position.

Referring to FIGS. 4A and 4B, when the pattern line of the coil portion has a circular or oval shape, the via 145 may be positioned at equal intervals of 45° (A).

As a distance between the coil pattern and an external electrode is increased, the influence of parasitic capacitance or a current flow between the coil pattern and the external electrode may be prevented, such that the via may be formed not to be adjacent to the external electrode.

If the vias are formed in an area contacting diagonal lines that connect between the edges of the body in the pattern line of the coil portion, the via pad, for connecting the vias, may be formed on an inner side of the coil portion, and the via pads formed in the other areas may be formed around the pattern line of the coil portion or may be formed on an outer side of the coil portion.

Referring to FIG. 4C, when the pattern line of the coil portion has the track shape, the via 145 may be positioned at an equidistant point of 90° and a point where a straight line and a curved line meet each other (A, B).

In particular, when the pattern line of the coil portion has the track shape, the via 145 may be disposed in a straight section of the coil portion. More vias may be formed within an allowable space when the vias are formed in the straight section of the coil portion (A) than when the vias are formed in the curved section of the coil portion (B), and a defect may be reduced when the vias are formed in the straight section of the coil portion (A)

The larger the allowable space for arranging vias in a certain region of the coil pattern, the greater the number of turns in the coil pattern of one layer. Therefore, when the number of turns of a specific coil is implemented, the number of turns of the coil may be satisfied even if the stacked number of coil layers is reduced, and thus the capacity may be realized. As a result, the space utilization may be increased even if the number of layers is reduced, such that the resistance may be lowered and the Q characteristics may be improved. Further, even if the number of coil layers is small, the number of turns of the coil may be implemented, such that the process may be simplified.

For example, if only two vias are disposed in one coil pattern, the number of turns of the coil pattern of one layer may be up to ½ of a turn. However, if more than five vias are disposed, the number of turns of the coil pattern may be increased.

Therefore, when the pattern line of the coil portion has the track shape, the number of vias that may be disposed in the straight section may be greater than in the case of the circular or oval shape, and the number of turns of the coil pattern may be higher than in the case of the circular or oval shape, such that the coil component having the improved resistance characteristics and Q characteristics may be secured.

When the pattern line of the coil portion is the track shape, the plurality of vias may be disposed in the straight section at equal intervals, and the number of vias that may be disposed in the straight section may be 3 to 5 but is not limited thereto.

The following Table 1 shows product characteristics of the coil component according to the exemplary embodiment of FIG. 1, and the coil component according to the comparative example of FIG. 4A. For reference, design rules of the coil components of the exemplary embodiment and the comparative example were the same except for a line width, the coil components were designed by changing only the coil shape, and the coil components of the exemplary embodiment and the comparative example were designed to have the same inductance capacity, for simple comparison.

TABLE 1

|  | Inductance (L; nH) | | Q | | Rs (Ω) | | Rs (Ω) | Change rate (0.5, 2.4 Hz) | | | |
| --- | --- | --- | --- | --- | --- | --- | --- | --- | --- | --- | --- |
|  | 0.5 | 2.4 | 0.5 | 2.4 | 0.5 | 2.4 | 0.001 | % L | % Q | % Rs | % Rdc |
| Comparative Example | 0.62 | 0.61 | 23.96 | 51.35 | 0.08 | 0.18 | 0.018 | 0.0% | 0.0% | 0.0% | 0.0% |
| Exemplary embodiment | 0.62 | 0.61 | 24.96 | 54.69 | 0.08 | 0.17 | 0.020 | −0.1% | 6.5% | −5.9% | 12.9% |

Referring to Table 1, above, it may be appreciated that, as compared to the coil component according to the comparative example, the coil component according to the exemplary embodiment in the present disclosure has the Q characteristics improved by about 6.5% even if the two compared configurations have the same inductance capacity.

According to the exemplary embodiment in the present disclosure, the body 110 may further include dummy leading portions 123 disposed on the plurality of insulating layers, and exposed externally.

The dummy leading portion 123 may be included within the body 110 by forming patterns on the plurality of insulating layers 111 in the same shape as the first leading portion 121*c* and the second leading portion 122*c*.

The dummy leading portion 123 may be connected to the first and second coil patterns 121 and 122 through first and second dummy vias (not shown), and the first coil pattern and the second coil pattern may be connected to each other in parallel.

That is, the plurality of insulating layers 111 on which the first and second coil patterns 121 and 122 are formed, and the plurality of insulating layers 111 on which the dummy leading portions 123 are formed, may be stacked adjacent to each other, such that the body 110 according to the exemplary embodiment in the present disclosure may be implemented.

The plurality of insulating layers on which the dummy leading portions 123 are formed are stacked adjacent to the plurality of insulating layers on which the first and second coil patterns 121 and 122 are formed, and thus a larger number of metallic bonds with external electrodes 131 and 132 disposed on the end surface in the longitudinal direction of the body 110 and the bottom surface of the body 110 may arise, such that an adhesion between the first and second coil patterns and the external electrode, and an adhesion between an electronic component and a printed circuit board, may be improved.

The stacked electronic component according to the exemplary embodiment in the present disclosure includes the first external electrode 131 disposed on one end surface in the longitudinal direction of the body 110 and the bottom surface of the body 110 and connected to the first leading portion 121*c*, and the second external electrode 132 disposed on the other end surface in the longitudinal direction of the body 110 and the bottom surface of the body 110 and connected to the second leading portion 122c.

The first external electrode 131 and the second external electrode 132 may be formed on the bottom surface of the body 110 and the surface perpendicular to the stacked surface of the body 110 and, in particular, on one end surface in the longitudinal direction of the body 110 and the other end surface opposite thereto, so that they are connected to the first leading portion 121c and the second leading portion 122c of the first and second coil patterns 121 and 122, respectively. The first external electrode 131 and the second external electrode 132 may also be connected to the dummy leading portions 123.

The first external electrode 131 and the second external electrode 132 may be formed of platable metals without being particularly limited. For example, the first external electrode 131 and the second external electrode 132 may be made of any one of nickel (Ni) and tin (Sn), a mixture thereof, or the like.

Hereinafter, a method of manufacturing a coil component according to an exemplary embodiment in the present disclosure will be described.

Figure 6:
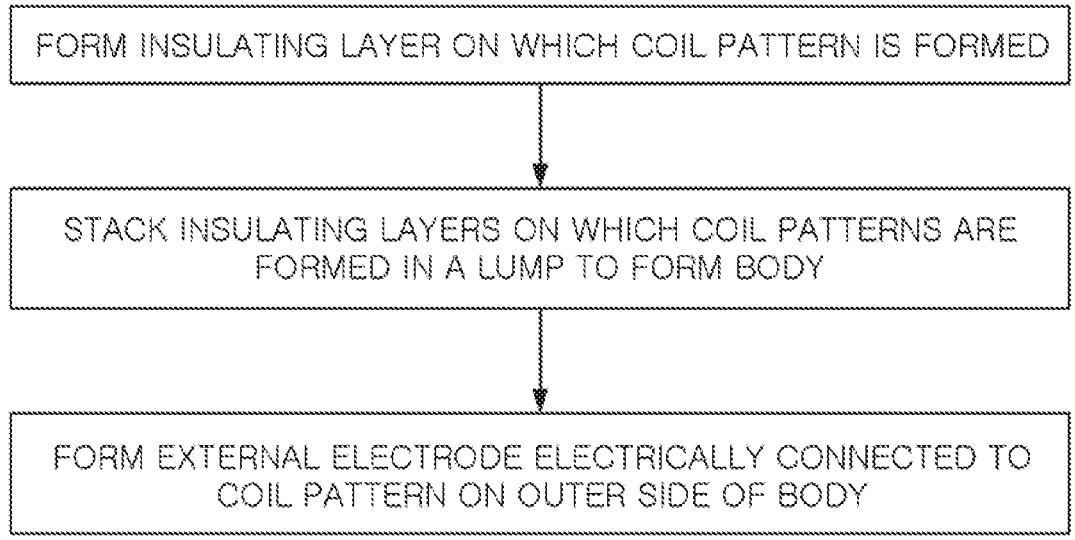
FIG. 6 is a process diagram illustrating a method of manufacturing a coil component according to an exemplary embodiment in the present disclosure.

FIG. 6 is a process diagram illustrating a method of manufacturing a coil component according to an exemplary embodiment in the present disclosure.

Referring to FIG. 6, a method of manufacturing a coil component according to an exemplary embodiment in the present disclosure may include forming an insulating layer that includes a coil pattern and stacking the insulating layers that include the coil patterns in a lump to form a body, in which the coil pattern may include the coil portion, the leading portion disposed on one side of the insulating layer, and the connection portion connecting the coil portion and the leading portion, the pattern line of the coil portion may have the arc shape, and the connection portion may be formed in the tangential direction of the coil portion from one end of the leading portion.

The coil pattern may be formed on a substrate.

The substrate may be formed of a resin or may be a copper clad laminate (CCL) in which a copper foil is coated on the resin to use a circuit board, but is not limited thereto.

The resin may be a phenol resin, an epoxy resin, polyester, polyimide, or the like.

The coil pattern may be formed by plating a conductive metal on the substrate, using a photosensitive film.

The conductive metal is not particularly limited, as long as it has excellent electrical conductivity. For example, the conductive metal may be any one of silver (Ag), palladium (Pd), aluminum (Al), nickel (Ni), titanium (Ti), gold (Au), copper (Cu), and platinum (Pt), a mixture thereof, or the like. For example, the conductive metal may be copper (Cu) but is not limited thereto.

The coil pattern may include the coil portion, the leading portion disposed on one side of the insulating layer, and the connection portion connecting the coil portion and the leading portion.

The pattern line of the coil portion may have the arc shape. For example, the pattern line may have any one of circular, oval, and track shapes.

The leading portion may be formed on a lower portion of one side of the insulating layer and may have an L-letter shape.

The connection portion may be formed in a tangent line direction of the coil portion from one end of the leading portion and may be in contact with an upper portion of the coil portion.

Next, the insulating layer that includes the coil pattern may be formed.

An insulating material may be bonded to the coil pattern to form the insulating layer that includes the coil pattern.

The insulating material may be formed to cover the coil pattern exposed on the substrate.

The insulating material used to manufacture the insulating layer is not particularly limited, but may use well-known ferrite powders such as a Mn—Zn-based ferrite powder, a Ni—Zn-based ferrite powder, a Ni—Zn—Cu-based ferrite powder, a Mn—Mg-based ferrite powder, a Ba-based ferrite powder, a Li-based ferrite powder, or the like.

Slurry prepared by mixing a magnetic material and an organic material with each other may be applied on a carrier film and then dried to prepare the plurality of insulating layers.

Next, the via may be formed on the insulating layer that includes the coil pattern.

The via may be formed to connect the coil patterns.

The via may be formed by forming the through hole using the mechanical drill, the laser drill, or the like and then filling the through hole with the conductive material by the plating.

The via may include conductive materials such as copper (Cu), aluminum (Al), silver (Ag), tin (Sn), gold (Au), nickel (Ni), lead (Pd), and an alloy thereof.

The coil pattern may be formed as a coil in the forming of the body by stacking the coil patterns, as described below.

Thereafter, the insulating layer may be separated from the substrate.

Next, the insulating layers that include the coil pattern may be stacked in a lump to form the body.

The plurality of insulating layers separated from the substrate may be stacked to form the body including the coil, of which the leading portion is exposed to the bottom surface of the body and the surface perpendicular to the stacked surface of the body.

The vias may be formed between the coil patterns, and the coil patterns formed on the insulating layers are electrically connected to each other through the vias to form one coil.

The leading portion of the coil pattern formed as one coil may be exposed to the bottom surface of the body and the surface perpendicular to the stacked surface of the body.

Meanwhile, the coil pattern may be formed in a direction perpendicular to the substrate mounted surface of the body.

Next, the external electrodes connected to the leading portions of the coil patterns, respectively, may be formed on the bottom surface of the body and the surface perpendicular to the stacked surface of the body.

The external electrode may be formed using the conductive paste including metals having excellent electrical conductivity, or may be formed by the metal plating. The metal may be either nickel (Ni) or tin (Sn), an alloy thereof, or the like.

A description of features that are the same as those of the stacked electronic component according to the exemplary embodiment in the present disclosure described above will be omitted.

As set forth above, according to an exemplary embodiment in the present disclosure, it is possible to improve the Q characteristics by lowering the resistance of the inductor.

While exemplary embodiments have been shown and described above, it will be apparent to those skilled in the art that modifications and variations could be made without departing from the spirit and scope of the present disclosure, as defined by the appended claims.

What is claimed is:

1. A coil component, comprising:
a body including a plurality of insulating layers having coil patterns respectively disposed on the plurality of insulating layers,
wherein the coil patterns include first coil patterns having a same shape and second coil patterns having a same shape,
each of the first coil patterns includes a first coil portion, a first leading portion disposed on one side of a respective one of the plurality of insulating layers, and a first connection portion connecting the first coil portion and the first leading portion to each other,
a pattern line of the first coil portion has an arc shape,
in each of the first coil patterns, the first connection portion extends, in a tangent line direction of an outer edge of the first coil portion, from one end of the first leading portion to the first coil portion,
each of the second coil patterns includes a second coil portion, a second leading portion disposed on one side of a respective one of the plurality of insulating layers, and a second connection portion connecting the second coil portion and the second leading portion to each other,
a pattern line of the second coil portion has an arc shape,
in each of the second coil patterns, the second connection portion extends, in a tangent line direction of an outer edge of the second coil portion, from one end of the second leading portion to the second coil portion, and
the one end of the first leading portion of each of the first coil patterns is disposed on one side of the body, and the one end of the second leading portion of each of the second coil patterns is disposed on another side of the body opposing the one side thereof.

2. The coil component of claim 1, wherein the pattern line of the first coil portion and the pattern line of the second coil portion have one of a circular shape, an oval shape, or a track shape.

3. The coil component of claim 1, wherein the first leading portion is disposed on a lower portion of one side of a respective one of the plurality of insulating layers and has an L-letter shape, and the second leading portion is disposed on a lower portion of one side of a respective one of the plurality of insulating layers and has an L-letter shape.

4. The coil component of claim 1, wherein the first connection portion contacts an upper portion of the first coil portion, and the second connection portion contacts an upper portion of the second coil portion.

5. The coil component of claim 1, wherein the first and second coil portions are connected to each other by vias overlapping each other in a stacking direction of the first and second coil portions.

6. The coil component of claim 5, wherein the pattern line of the first coil portion and the pattern line of the second coil portion have a track shape, and
the vias are disposed in straight sections of the first coil portions and the second coil portions, respectively.

7. The coil component of claim 1, wherein the body has a top surface, a bottom surface, and an end surface connecting the top surface and the bottom surface, and
the first coil patterns and the second coil patterns are perpendicular to the top surface and the bottom surface.

8. The coil component of claim 1, further comprising:
a first external electrode connected to each first leading portion and disposed on a portion of a bottom surface and a first end surface of the body; and
a second external electrode connected to each second leading portion and disposed on another portion of the bottom surface and a second end surface of the body opposing the first end surface.

9. The coil component of claim 8, wherein each of the first and second external electrodes has an L-letter shape.

10. A coil component, comprising:
a body including a plurality of insulating layers having coil patterns disposed on the plurality of insulating layers,
wherein each coil pattern includes a coil portion, a leading portion disposed on one side of the insulating layer, and a connection portion connecting the coil portion and the leading portion,
a pattern line of the coil portion has an arc shape,
the connection portion extends, in a tangent line direction of an outer edge of the coil portion, from one end of the leading portion to the coil portion,
the coil patterns are connected to each other by three or more vias, and
an interval between adjacent vias, in a stacking direction of the coil patterns, of the three or more vias is the same.

11. The coil component of claim 10, wherein the pattern line of the coil portion has a circular shape or an oval shape.

12. The coil component of claim 10, wherein the interval is 45°.

13. The coil component of claim 10, wherein the leading portion is disposed on a lower portion of one side of a respective one of the plurality of insulating layers and has an L-letter shape.

14. The coil component of claim 10, wherein the body has a top surface, a bottom surface, and an end surface connecting the top surface and the bottom surface, and
the coil pattern is perpendicular to the top surface and the bottom surface.

15. The coil component of claim 10, further comprising an external electrode electrically connected to the coil pattern and disposed on a portion of a bottom surface and an end surface of the body.

16. A coil component, comprising:
a body including a plurality of insulating layers having coil patterns disposed on the plurality of insulating layers,
wherein the coil pattern includes a coil portion, a leading portion disposed on one side of the insulating layer, and a connection portion connecting the coil portion and the leading portion,
a pattern line of the coil portion has a track shape,
the connection portion extends, in a tangent line direction of an outer edge of the coil portion, from one end of the leading portion to the coil portion,
the pattern line of the coil portion has the track shape,
the coil patterns are connected to each other by vias,
the vias are positioned at points where straight lines and curved lines of the coil patterns meet each other and at equidistant points of the curved lines.

17. The coil component of claim 16, wherein the leading portion is disposed on a lower portion of one side of the insulating layer and has an L-letter shape.

18. The coil component of claim 16, further comprising another via disposed in a straight section of the coil portion.

19. The coil component of claim 16, wherein the body has a top surface, a bottom surface, and an end surface connecting the top surface and the bottom surface, and
the coil pattern is perpendicular to the top surface and the bottom surface.

20. The coil component of claim 16, further comprising an external electrode electrically connected to the coil pattern and disposed on a portion of a bottom surface and an end surface of the body.

\* \* \* \* \*